United States Patent [19]

Heinz et al.

[11] Patent Number: 4,962,725
[45] Date of Patent: Oct. 16, 1990

[54] APPARATUS FOR PRODUCING METAL-FREE STRIPS ON VACUUM-COATED FILM WEBS, PARTICULARLY TO BE USED WITH CAPACITORS

[75] Inventors: Jochen Heinz, Linden-Leihgestern; Thomas Krug, Hanau; Klemens Rubsam, Jossgrund; Hans Kessler, Hanau; Siegfried Kleyer, Hainburg, all of Fed. Rep. of Germany

[73] Assignee: Leybold Aktiengesellschaft, Hanau, Fed. Rep. of Germany

[21] Appl. No.: 413,637

[22] Filed: Sep. 28, 1989

[30] Foreign Application Priority Data

Jul. 6, 1989 [DE] Fed. Rep. of Germany ....... 3922187

[51] Int. Cl.$^5$ ............................................. C23C 14/12
[52] U.S. Cl. .................................. 118/718; 118/719; 118/726; 118/72
[58] Field of Search ................. 118/72, 718, 719, 725, 118/726, 730

[56] References Cited

U.S. PATENT DOCUMENTS 4,478,878 10/1984 Neuwald .............................. 118/718
4,508,049 4/1985 Behn et al. ........................... 118/719

FOREIGN PATENT DOCUMENTS 2234510 1/1974 Fed. Rep. of Germany .
2112405 3/1975 Fed. Rep. of Germany .
1138692 1/1969 United Kingdom .
2204733 6/1987 United Kingdom .

Primary Examiner—Richard Bueker
Attorney, Agent, or Firm—Felfe & Lynch

[57] ABSTRACT

In a device for producing metal-free strips on vacuum-coated film webs, particularly for capacitors, including a casing 32 with a cover 30 for sealing the casing pressure-tight and a winding unit 29, including guiding and tensioning rollers 5 to 17 which are rotatably disposed between the plates 3, 4, at least one coating roller and a take-off and a take-up roller 35', 37' as well as a coating source 19 supported in the casing 32 and a preferably tubular vessel 34 for receiving a separating agent 33 to be evaporated, for example oil, which is disposed transversely to the running direction of the web and has at least one nozzle 36 for the separating agent 33 to emerge from the vessel 34 onto the film web 50 passing by the outlet nozzle 36 in direct vicinity, the vessel 34 is at least partially filled with a supply of separating agent 33 and is provided with at least one vapor outlet pipe 39 the outlet nozzle of which 36 ends into the coating chamber 45 below the surface level 46 of the supply of separating agent 33 and in direct vicinity of the film web 50 to be coated and the end of vapor outlet pipe 39 which faces away from the nozzle 36 ends in the space 40 of the vessel above the supply of separating agent 33.

6 Claims, 2 Drawing Sheets

APPARATUS FOR PRODUCING METAL-FREE STRIPS ON VACUUM-COATED FILM WEBS, PARTICULARLY TO BE USED WITH CAPACITORS

BACKGROUND OF THE INVENTION

The invention relates to a device for producing metal-free strips on vacuum-coated film webs, particularly to be used with capacitors. The devices includes a casing, a cover for sealing the casing pressure-tight, and a winding unit which has guiding and tensioning rollers rotatably supported between plates, at least one coating roller and a take-up and take-off roller as well as a coating source supported in the casing. A preferably tubular vessel is disposed transversely to the running direction of the web for holding a separating agent which can be evaporated, for example oil, by at least one nozzle so as to allow the separating agent to emerge from the vessel onto the web which passes by the outlet nozzle in direct vicinity.

A process is known for producing metal-free strips when applying a metal coating onto a strip of insulating material (German patent No. 32 24 234, to which U.S. Pat. No. 4,478,878 corresponds, and German AS No. 26 52 438) which is used for electric capacitors wherein this insulating strip is covered in the area of the metal-free strip to be produced by a continuous covering strip which sits closely on the insulating strip and moves along at the same speed. Before entering the evaporating zone, the side facing the evaporator is coated with oil and after passing through the evaporating zone. After separating covering strip and insulating strip, the coated metal is stripped off. For this purpose, the metallized insulating strip and the covering strip are first brought in contact. An oil layer is then produced by evaporation of the latter which is then deposited on the lateral surfaces of the covering strip and, to a small extent, on the adjacent surface areas of the insulating strip and, subsequently, evaporated metal is deposited.

Further, a device is known (German patent No. 12 62 732) for simultaneously applying a deposit of parallel strips of liquid or greasy substances by evaporation at a low vapor pressure, preferably oily substances, particularly onto strips used in the manufacture of electric capacitors as covering agents for a subsequent metal deposition; this device includes an evaporating vessel enclosed by a heating winding and provided with several evaporating nozzles which are fed from a supply vessel and a tubular evaporating vessel is provided which has a number of nozzles corresponding to the number and the width of the covering strips to be produced and which is provided with an inlet.

Finally, a process is known (German patent No. 11 27 474) for continuously burning away small strips from a thin metal deposit applied by evaporation, in particular, on a strip-like dielectric of an electric capacitor by means of wheel-like burn-off electrodes. Two burn-off wheels with a burning voltage source (+, −) disposed therebetween, are guided along the layer one next another and spaced apart in a small distance. The layer segments between the contact points of the wheels are burned away and the burned away material is continuously removed.

SUMMARY OF THE INVENTION

It is now an object of the present invention to further develop a device for applying separating agents such that it can also be used in coating systems in which the vapor beam emerges vertically in a downward direction, or at an angle in a downward direction, and in which the separating agent cannot condense in the vicinity of the nozzle thus causing a failure in operation.

The object is accomplished in that the evaporating vessel, which is at least partially filled with separating agent, is provided with a vapor outlet pipe the outlet nozzle of which ends below the surface level of the supply of separating agent into the chamber in direct vicinity of the film web to be coated. The end of the vapor outlet pipe which faces away from the nozzle ends in the space above the supply of separating agent.

DETAILED DESCRIPTION OF THE PREFERRED EMBODIMENTS

Figure 1:
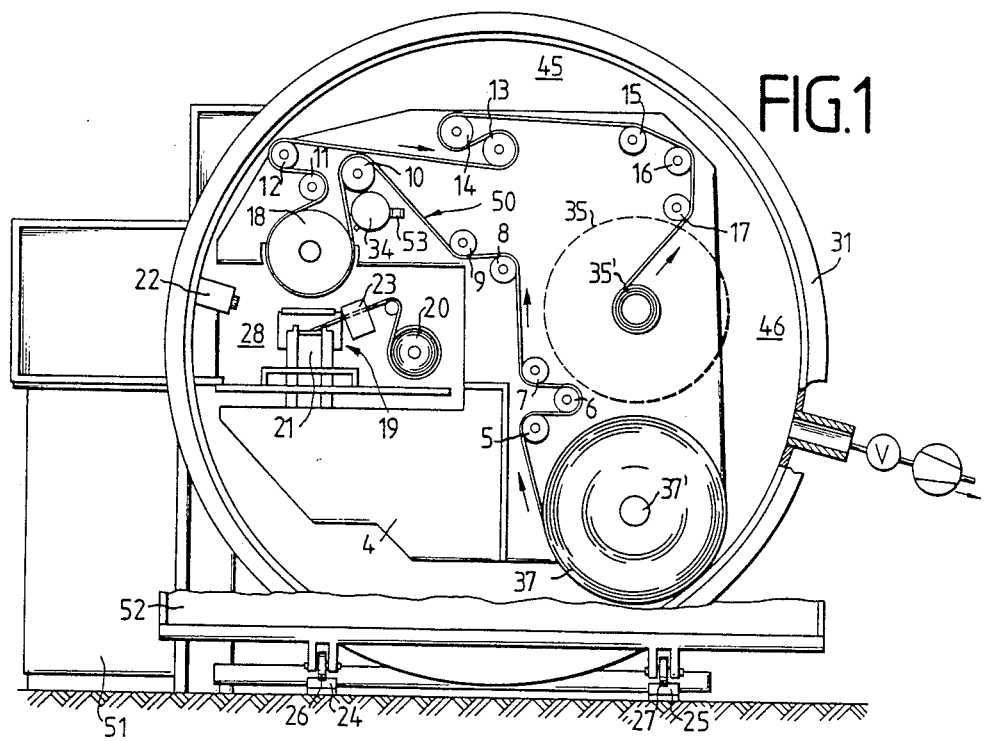
FIG. 1 is a top view on a part of the strip coating system the winding device of which is moved out of the hollow cylindrical coating chamber for charging purposes; some of the guiding and tensioning rollers of FIG. 2 are not represented in further detail for reasons of clarity.

Substantially, the strip coating system includes the guiding, tension measuring, expanding, and tensioning rollers 5 to 17 which are disposed between the two plates 3, 4; further, the cooled coating roller 18, the take-off roller 37' and the take-up roller 35', the coating source 19 which is disposed in the coating chamber 28 which is formed by a hollow cylinder 32 including an aluminum coil 20 and the evaporating vessel 21 as well as a camera 22 for monitoring the coating process. Together with the rollers 5 to 17 and the coating drum 18 which make up the winding unit 29, the two plates 3, 4 which are attached to the support 52 can be introduced and withdrawn from the coating chamber 28 in direction of arrow R via rollers 26, 27 on rails 24, 25. When the winding device 29 is moved in, the discoidal cover 30 which is fixed to the support 52 contacts with its margin the flange-like front surface 31 of the hollow cylinder 32 where it is attached in a stationary position fixed by means of clamps which are not represented in further detail. Because of the subatmospheric pressure which prevails in the chamber 45 during operation, the atmospheric pressure pulls the cylinder 32 against the front surface 31.

Figure 3:
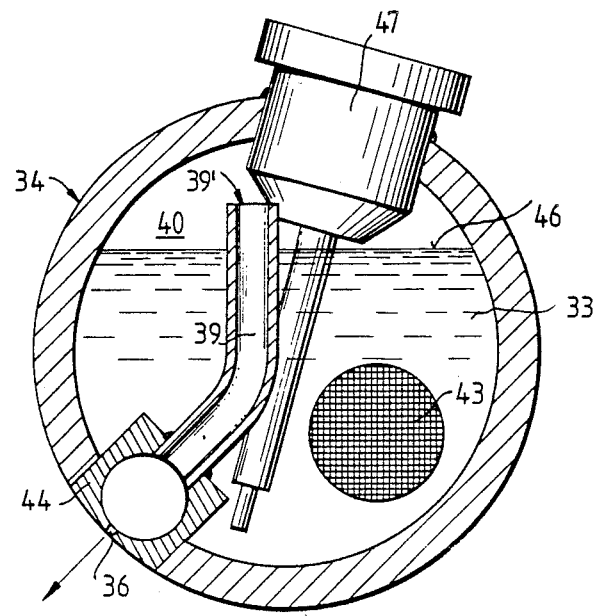
FIG. 3 is an enlarged view of a cross section through the tubular vessel for evaporating the separating agent.

The evaporating vessel 34 of FIG. 3 is formed by one tubular piece, both ends of which are sealed by discoidal end pieces. The interior of the vessel 34 holds rod-like heating element 43 which is completely enclosed by the separating agent 33 and is close to the vapor outlet pipe 39; this pipe 39 is supported in a vertical position on the bottom of the vessel 34; this is made possible in that the nozzle head 44 of the vapor outlet pipe 39 is soldered or welded to the wall of vessel 34; the length of the vapor outlet pipe 39 is selected such that the top end 39' of the pipe 39 ends into the chamber 40 above the bath level 46 of the separating agent 33. Advantageously, the vessel 34 is additionally provided with a temperature sensor 47 which permits an excellent monitoring and maintaining of the bath temperature of the separating agent (the circuit required for the monitoring and controlling of the heating is not represented in further detail in this drawing).

The evaporating vessel 34 is supported between the two plates 3, 4 by means of elbows 53, 53' in such a way that the beam direction of the nozzle 36 is pointed toward the side of the strip or film 50 to be coated.

Figure 2:
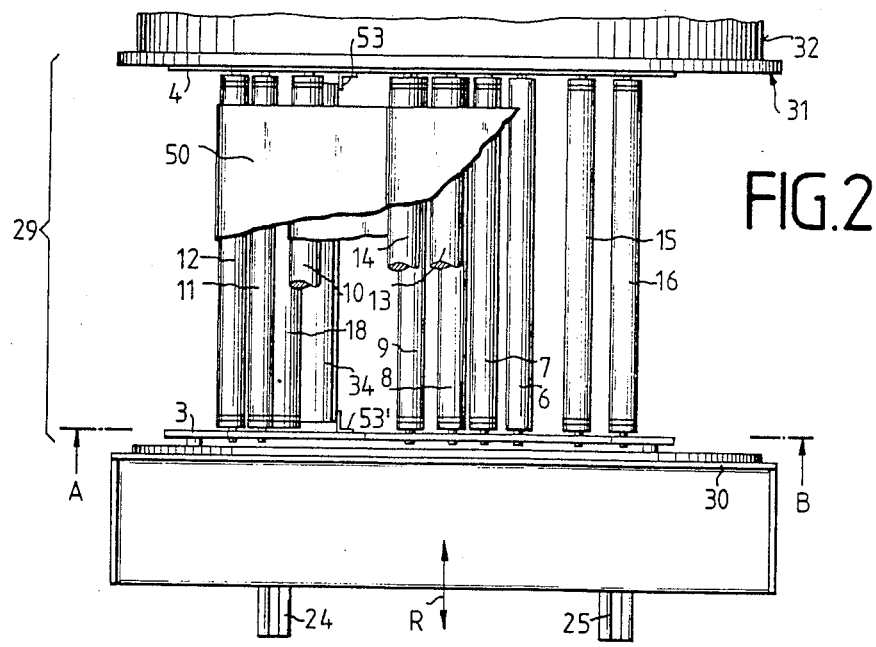
FIG. 2 is a side view of the system in a section taken along the lines A—B in FIG. 1.

As it can be seen from FIG. 2, the nozzle 36 is disposed at a segment of the web which is between the guiding roller 10 and the coating drum 18 such that the actual coating process starts directly after the film 50, which is passing by, is moistened with separating agent. It is obvious that metal which is evaporated in the evaporating vessel 21 is not deposited on parts of the film 50 which were moistened with separating agent (for example silicon oil); hence, the number of nozzles 36 which are juxtaposed over the length of the vessel 34 determine how many segments of the lateral surface of the film web 50 are not provided with a coating or deposit.

The device according to FIGS. 1 and 2 shows drums 5 to 17 for transporting and guiding the film web 50 which are disposed such that the part of the film web 50 which is directly in front of the coating drum 18 runs at an acute angle, i.e. almost vertically, from the drum 10 in a downward direction. It is obvious that this part of the film web 50 can also by guided differently; it can, for example, approach the coating drum 18 in a horizontal plane which does not require a design modification of the evaporator 34 represented in further detail in FIG. 3.

LISTING OF INDIVIDUAL PARTS 3 plate
4 plate
5 guiding roller
6 tensioning roller
7 guiding roller
8 guiding roller
9 expanding roller
10 guiding roller
11 tension measuring roller
12 tensioning roller
13 measuring drum
14 guiding roller
15 expanding roller
16 tension measuring roller
17 guiding roller
18 cooled coating drum
19 evaporating source
20 aluminum wire coil
21 evaporating vessel
22 camera
23 wire supply
24 rail
25 rail
26 roller
27 roller
28 coating chamber
29 winding unit
30 cover
31 front surface
32 hollow cylinder, casing
33 separating agent, oil
34 vessel, evaporating vessel
35 wound-up material
35' take-up roller
36 nozzle
37 material to be wound off
37' take-off roller
39 vapor outlet pipe
40 space
42 surface of separating agent
43 heating element
44 nozzle head
45 chamber
46 bath level
47 temperature sensor
50 web, strip, film
51 control cubicle
52 support
53 elbow
53' elbow

We claim:

1. Apparatus for producing metal-free strips on vacuum coated film webs, comprising
   a casing having a cover for sealing the casing pressure-tight,
   a winding unit including guiding and tensioning rollers rotatably disposed between a pair of vertical plates,
   a coating roller,
   a take-off roller,
   a take-up roller,
   an elongate vessel for receiving a separating agent to be evaporated at a certain level therein, said vessel being disposed substantially horizontally and transversely to the running direction of the web and having at least one vapor outlet pipe therein, said outlet pipe having an end inside said vessel above said level of said separating agent and being connected to at least one opposed outlet nozzle in the immediate vicinity of said web, said nozzle being disposed below said level of said separating agent.

2. Apparatus as in claim 4 wherein said vessel is tubular.

3. Apparatus as in claim 1 wherein said nozzle comprises a nozzle head fixed to said vessel, said outlet pipe being fixed to said nozzle head.

4. Apparatus as in claim 3 wherein said nozzle head is screwed into said vessel.

5. Apparatus as in claim 4 wherein said vessel is tubular, whereby said nozzle is radially aligned relative to the axis of said tube.

6. Apparatus as in claim 1 further comprising heating means supported in said vessel below the level of said separating agent.

* * * * *

UNITED STATES PATENT AND TRADEMARK OFFICE
CERTIFICATE OF CORRECTION

PATENT NO. : 4,962,725
DATED : October 16, 1990
INVENTOR(S) : Heinz et al.

It is certified that error appears in the above-identified patent and that said Letters Patent is hereby corrected as shown below:

Column 1, lines 32 and 32, delete "and after" and insert
    --. After--; after "zone" delete "."; delete
    "After" and insert --and after--.

Column 4, line 45 (Claim 2), delete "4" and insert --1--.

Signed and Sealed this

Twenty-fifth Day of August, 1992

Attest:

DOUGLAS B. COMER

*Attesting Officer*    Acting Commissioner of Patents and Trademarks